United States Patent
Wu et al.

(10) Patent No.: US 6,875,654 B2
(45) Date of Patent: Apr. 5, 2005

(54) MEMORY DEVICE AND FABRICATION METHOD THEREOF

(75) Inventors: Tieh Chiang Wu, Iian Hsien (TW); Chien-Chang Huang, Banchiau (TW); Chin-Ling Huang, Shulin (TW); Bo Ching Jiang, Hualien Hsien (TW); Yu-Wei Ting, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/730,674

(22) Filed: Dec. 8, 2003

(65) Prior Publication Data

US 2004/0115927 A1 Jun. 17, 2004

(30) Foreign Application Priority Data

Dec. 17, 2002 (TW) ........................................ 91136416 A

(51) Int. Cl.[7] .......................................... H01L 21/8242
(52) U.S. Cl. ........................................ 438/243; 438/386
(58) Field of Search ................................ 438/243, 253, 438/254, 386, 396, 398, 700

(56) References Cited

U.S. PATENT DOCUMENTS

| | | | |
|---|---|---|---|
| 5,498,564 A | * | 3/1996 | Geissler et al. ............. 438/247 |
| 6,762,447 B1 | * | 7/2004 | Mandelman et al. ....... 257/301 |
| 6,784,477 B2 | * | 8/2004 | Jang ........................... 257/301 |

* cited by examiner

Primary Examiner—David Nhu
(74) Attorney, Agent, or Firm—Quintero Law Office

(57) ABSTRACT

A memory device and fabricating method thereof. In the memory device of the present invention, a substrate has a plurality of deep trenches, wherein the deep trenches formed in the adjacent rows are staggered. A deep trench capacitor and a control gate are disposed in each deep trench successively. Word lines are disposed on the control gates respectively, and each word line is electrically coupled to the control gate thereunder. Diffusion regions are disposed in the substrate and surrounding the deep trenches respectively to serve as sources of vertical transistors. Each diffusion region is electrically connected to the surrounding deep trench capacitor. Active areas are disposed on the rows of the control gates respectively along a second direction. The regions where each active area overlaps the control gates have at least one indentation.

7 Claims, 7 Drawing Sheets

MEMORY DEVICE AND FABRICATION METHOD THEREOF

BACKGROUND OF THE INVENTION

1. Field of the Invention

The present invention relates to a memory device, and more particularly, to a memory device with vertical transistors and a fabrication method thereof.

2. Description of the Related Art

FIG. 1 is a layout of a conventional memory device with vertical transistors and deep trench transistors. As shown in FIG. 1, a plurality of deep trench capacitors 10 are formed in the substrate (not shown), and the deep trench capacitors formed in adjacent rows are staggered. A plurality of word lines 12 are disposed above the columns of the deep trench capacitors respectively, along the vertical direction. A control gate (not shown) is disposed between each deep trench 10 and each word line 12, and is electrically coupled to the word line 12 thereon. A plurality of active areas 14 are formed in the substrate along the horizontal direction. Each active area 14 is disposed above one row of the deep trench capacitors 10, and overlaps the control gates thereunder.

Although the deep trench capacitors shown in FIG. 1 are rectangular, in fact, trench capacitors are actually octagonal due to the semiconductor fabrication process, as shown in FIG. 2A. FIG. 2B shows a misalignment between the active area 14 and control gate in a deep trench capacitor 10. FIG. 3A is an enlarged view of the region 19 in the FIG. 2B. Typically, the region 21 is a gate oxide layer of a transistor (not shown), and region 23 is a portion of an active area 14 and is composed of Si. The region 25 composed of polysilicon is another portion of the active area 14 and serves as the gate of the transistor (not shown). The region 27 is a deep trench isolation composed of silicon oxide. FIG. 3B shows a silicon on isolation (SOI) structure. As shown in FIG. 3A, the regions 21, 23, 25 and 27 form an SOI structure. FIG. 3C shows the relationship between threshold voltage and the thickness of a silicon transistor with an SOI structure. In a memory device as shown in FIG. 3A, the silicon thickness of the transistor with an SOI structure may decrease when a misalignment occurs between the active areas 14 and the control gate on the deep trench capacitors 10. When this condition is met, an angle of the lateral surface 141 of the active area 14 relative to lateral surface 29 of the region 21 is Ø1, and is not equal to 90°. The smaller angle Ø1 the smaller thickness W. Consequently, the threshold voltage of the vertical transistor (not shown) is reduced as the thickness W is reduced, as shown in FIG. 3C.

In view of this, memory devices with vertical transistors and deep trench capacitors suffer a decrement in threshold voltage of the vertical transistors, and further, current leakage or malfunctions due to misalignment of active areas and control gates on the deep trench capacitors thereof may occur.

SUMMARY OF THE INVENTION

An object of the present invention is to provide a memory device with better misalignment tolerance for shifting between active areas and control gates.

According to the above mentioned object, the present invention provides a memory device with vertical transistors. In the memory device of the present invention, a substrate has a plurality of deep trenches, wherein the deep trenches formed in the adjacent rows are staggered. A plurality of deep trench capacitors are disposed in the deep trenches of the substrate respectively. A plurality of control gates are disposed on the deep trench capacitors respectively. A plurality of word lines are disposed on the control gates respectively along a first direction. Each word line is electrically coupled to the control gate thereunder. A plurality of diffusion regions are disposed in the substrate and surround the deep trenches respectively to serve as sources of vertical transistors. Each diffusion region is electrically coupled to the surrounding deep trench capacitor. A plurality of active areas are disposed on the rows of the control gates respectively along a second direction. The regions where each active area overlaps the control gates have at least one indentation. A plurality of drains are disposed in the active areas beside each word line.

According to the above mentioned object, the present invention provides a method of fabricating a memory device. In the method of the present invention, a plurality of deep trenches are formed in a substrate, and a deep trench capacitor is formed in each deep trench. Next, a diffusion region surrounding each deep trench capacitor is formed in the substrate, and a control gate is formed on each deep trench capacitor. Then, a word line is formed on each control gate along a first direction, and an active area is formed corresponding to one row of the control gates. The regions where the active area overlaps the control gates have a recessed portion on both sides. Finally, two drains are formed on the active area beside the word line using the word line as a mask.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The method of fabricating a memory device according to the present invention is described below with reference to FIGS. 4–6. First, a plurality of deep trenches are formed in a substrate (not shown), wherein the deep trenches formed in adjacent rows are staggered. Then, deep trench capacitors 10 are formed in the deep trenches respectively. Therefore, the deep trench capacitors 10 formed in adjacent rows are staggered.

Next, a diffusion region 12S surrounding each deep trench capacitor 10 is formed in the substrate by thermal diffusion. The diffusion regions 12S serve as the sources of transistors T12. Then, a control gate is formed on each deep trench capacitor 10. Thus, the control gates formed in adjacent rows are staggered. For example, a silicon oxide layer is formed on upper sidewalls of each trench and on each deep trench capacitor 10. The bottom silicon oxide layer serves as an isolation layer 121, and the silicon oxide layer on the upper sidewalls serve as the gate oxide layer 12GX of the transistors T12. Thereafter, a polysilicon layer is formed in each deep trench to serve as the gate 12G of the transistors T12. Each control gate of the transistor T12 consists of a gate 12G and gate oxide layer 12GX.

A plurality of word lines 12 composed of polysilicon are then formed on the substrate along a first direction, for example the vertical direction. Each word line 12 is disposed on the corresponding control gate (12G and 12GX) above the deep trench capacitor 10. Each word line 12 is electrically coupled to the corresponding gate 12G thereunder.

Figure 6A:
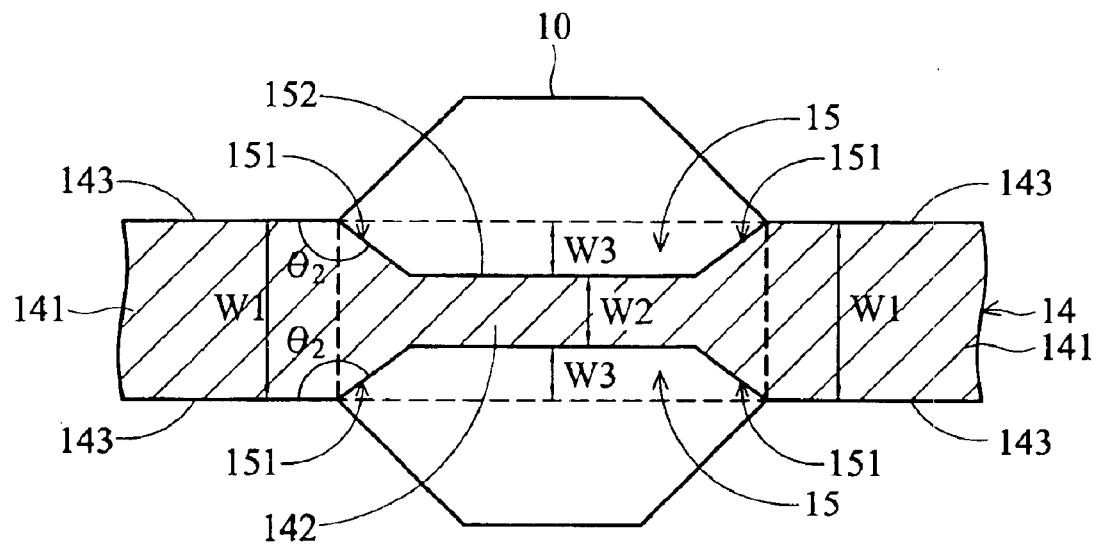
FIG. 6A is a plane view illustrating the relationship between the active area and the control gate on the deep trench capacitor.

Next, a plurality of active areas 14 are defined in the substrate by deep trench isolation. In the present invention, each active area 14 is aligned with one row of the control gate (12G and 12GX), and each has normal portions 141 and recessed portions 142 (as shown in FIG. 6A). Each normal portion 141 has a first width W1, and each recessed portion 142 has a second width W2 smaller than the first width W1. Each recessed portion 142 is disposed between two normal portions 141, and each overlaps one control gate (12G and 12GX) thereunder. Each recessed portion 142 has an indentation 15 on both sides. Each normal portion 141 has a lateral surface 143 on both sides, and each recessed portion 141 has two slanted surfaces 151 and a plane surface 152 extends from the slanted surface 151 to the lateral surface 143. In the present invention, each plane surface 151 has a width diminution W3 relative to the lateral surface 143. The angle Ø2 of the lateral surface 143 relative to the slanted surface 151 is 135°, as show in FIG. 6A.

Subsequently, drains 12D are formed on both sides of each word line 12 using the word lines 12 as masks. Thus, each vertical transistor T12 consists of a drain 12D, a source 12S, a gate oxide layer 12GX and a gate 12G.

Finally, a plurality of bit lines 16 are disposed on the active areas 14 respectively along a second direction, for example the horizontal direction. Each bit line 16 is electrically coupled to the drain 12D in the active area 14 thereunder through a bit line contact.

Figure 4:
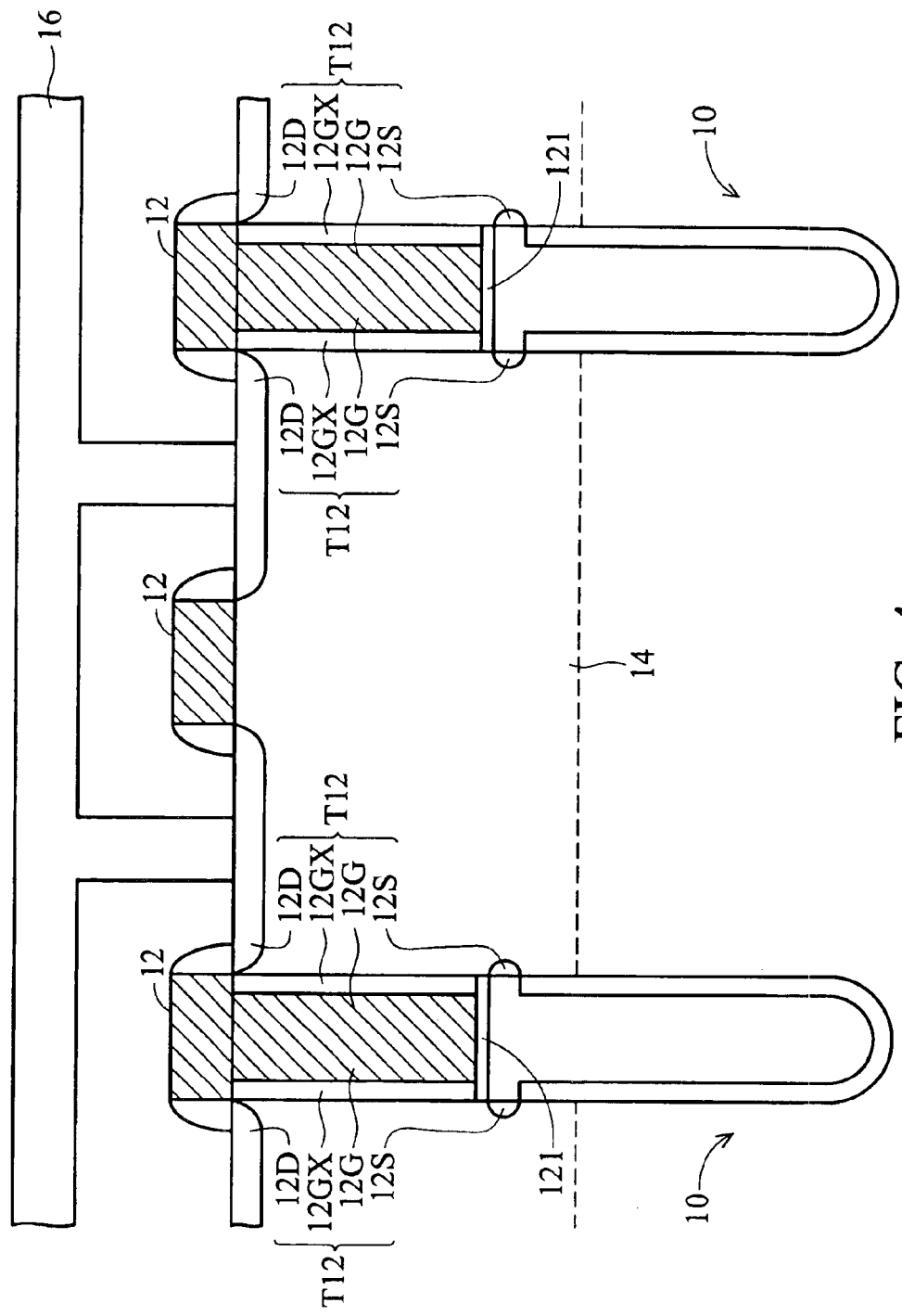
FIG. 4 is a cross section of the memory device according to the present invention.
Figure 5:
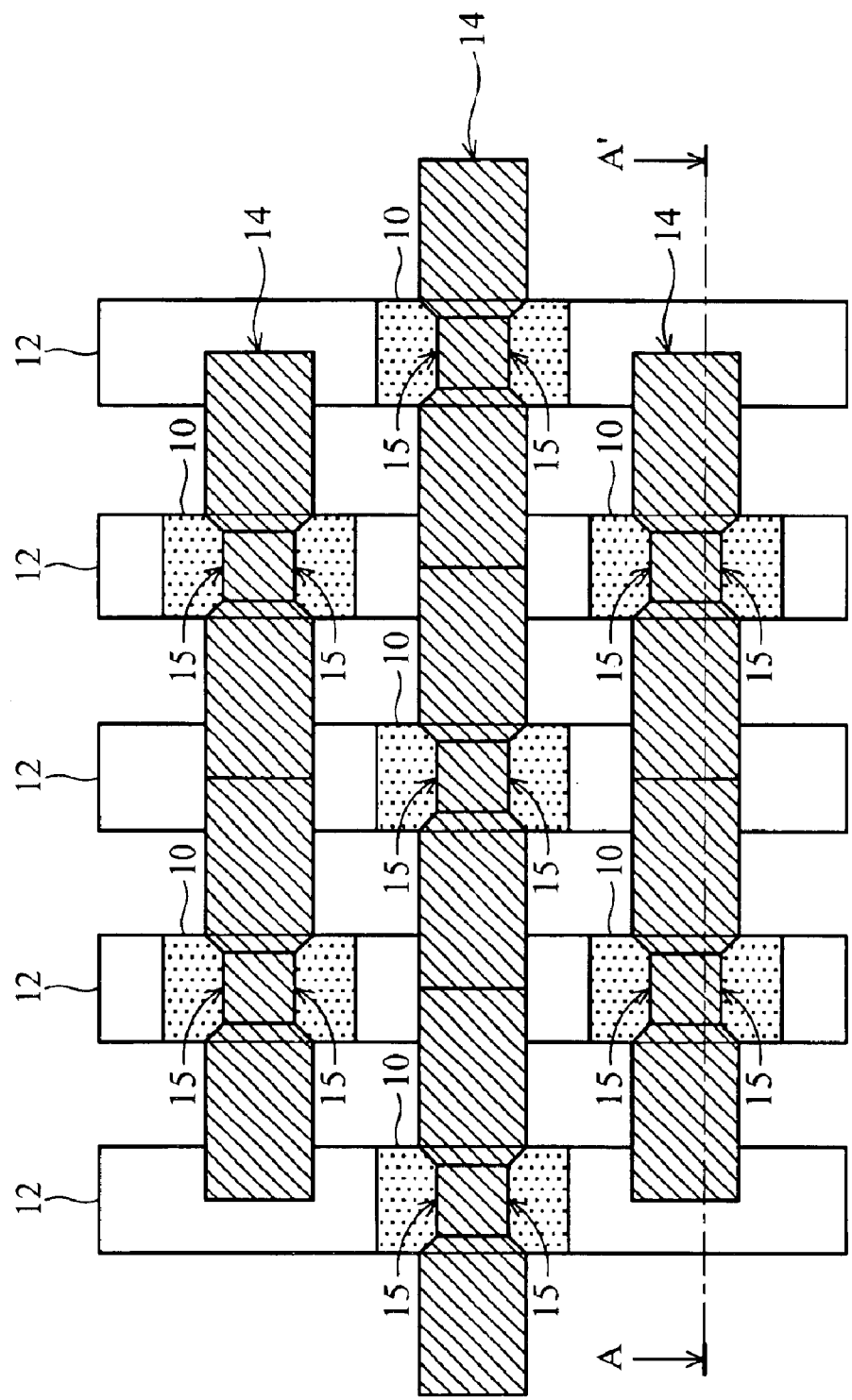
FIG. 5 is a layout of the memory device of the present invention.

FIG. 5 is layout of the memory device according to the present invention, and FIG. 4 is a cross section of FIG. 5 along line AA'. The structure of the memory device is described below, with reference to the FIGS. 4–6. In the memory device of the present invention, deep trench capacitors 10 are disposed in the deep trenches of the substrate respectively. The deep trench capacitors 10 in the adjacent rows are staggered. A plurality of control gates (12G and 12GX) are disposed on the deep trench capacitors 10 respectively. Thus, the control gates (12G and 12GX) formed in the adjacent rows are staggered because the deep trench capacitors 10 formed in the adjacent rows are staggered. A plurality of word lines 12 are disposed on the control gates (12G and 12GX) respectively along a first direction, for example the vertical direction. Each word line 12 is electrically coupled to the gate 12G thereunder. A plurality of diffusion regions 12S are disposed in the substrate and surrounding the deep trench capacitors 10 respectively to serve as sources of the vertical transistors T12. Each diffusion region 12S is electrically connected to the surrounding deep trench capacitor 10. A plurality of active areas 14 are disposed on the rows of the control gates (12G and 12GX) respectively along a second direction, for example the horizontal direction. In the present invention, each active area 14 is aligned to one row of the control gate (12G and 12GX), and each has normal portions 141 and recessed portions 142. Each normal portion 141 has a first width W1 and each recessed portion 142 has a second width W2 smaller than the first width W1. Each recessed portion 142 is disposed between two normal portions 141, and each overlaps one control gate (12G and 12GX) thereunder. Each recessed portion 142 has an indentation 15 on both sides. Each normal portion 141 has a lateral surface 143 on both sides and each recessed portion 142 has two slanted surfaces 151 and a plane surface 152 extends from the slanted surface 151 to the lateral surface 143. In the present invention, each plane surface 152 has a width diminution W3 relative to the lateral surface 143. The angle Ø2 of the lateral surface 143 relative to the plane surface 152 is 135°, as show in FIG. 6A. A plurality of drains 12D are disposed in the active areas 14 beside each word line 12.

Figure 3A:
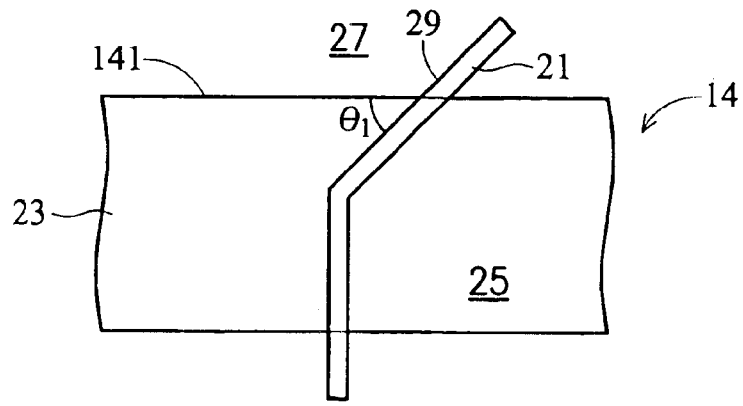
FIG. 3A is an enlarged view of the region 19 in the FIG. 2B.
Figure 3B:
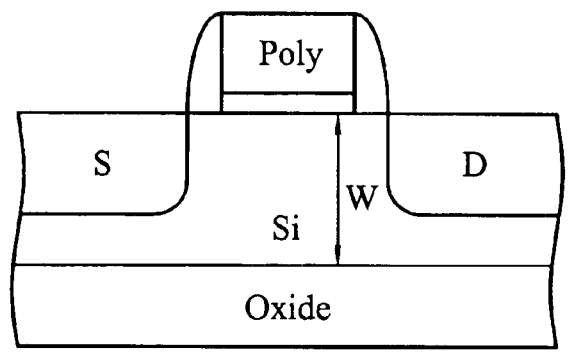
FIG. 3B is a diagram showing a silicon on isolation (SOI) structure.
Figure 3C:
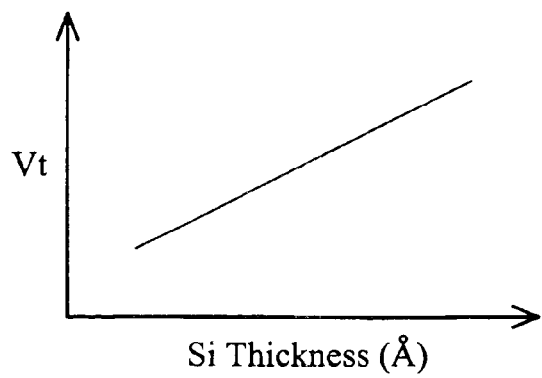
FIG. 3C is a relationship between the threshold voltage and the silicon thickness of transistors with an SOI structure.
Figure 6B:
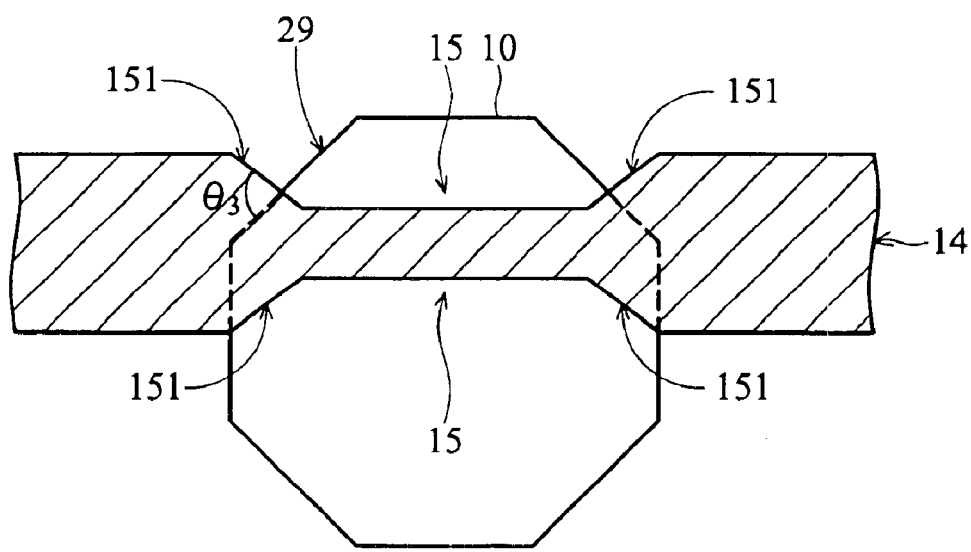
FIG. 6B is a plane view illustrating a misalignment between the active area and the control gate on the deep trench capacitor according to the present invention.

FIG. 6B is a plane view of memory device when the active area is misaligned according to the present invention. In the present invention, each active area 14 has two indentations 15 and the angle of the lateral surface 29 relative to the slanted surface 151 is 135°. Thus, when active area has a misalignment as shown in FIG. 6B, the angle Ø3 of the lateral surface 29 of the control gate (12G and 12GX) relative to the slanted surface 151 of the active area 14 is about 90°. The thickness W in the SOI structure shown in FIG. 3B may be maintained as constant as the angle of the lateral surface 29 relative to the slanted surface 151 is about 90°. Consequently, the threshold voltage of the vertical transistor T2 can be maintained as constant.

Figure 1:
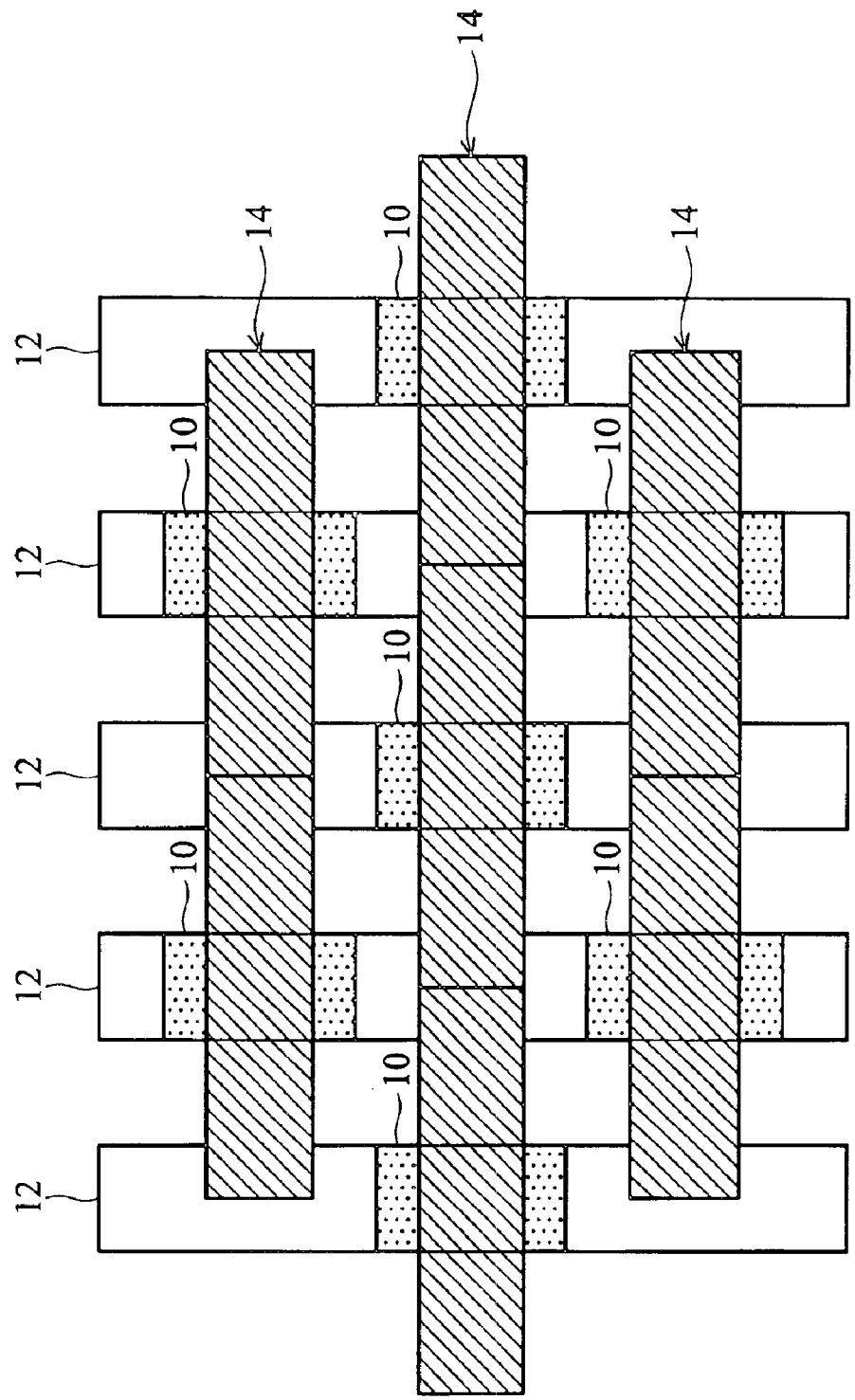
FIG. 1 is a layout of a memory device with vertical transistors and deep trench transistors.
Figure 2A:
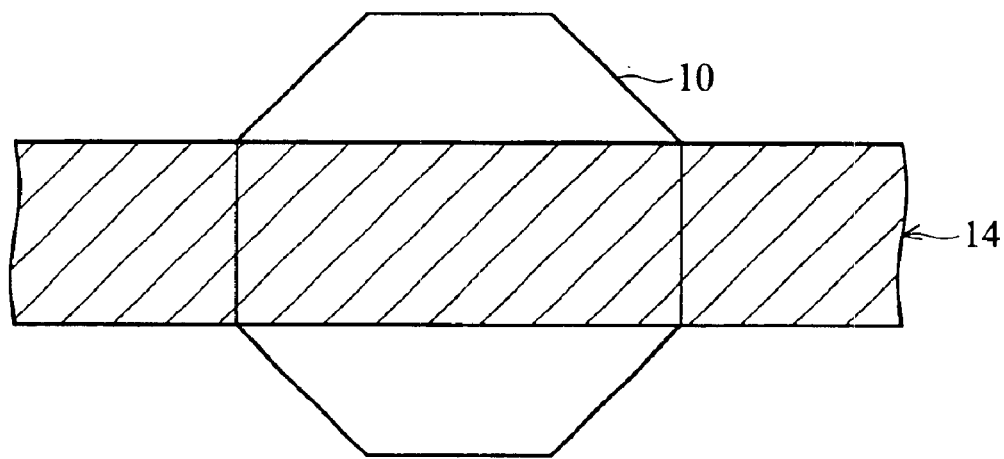
FIG. 2A shows the actual shape of the trench capacitors in FIG. 1.
Figure 2B:
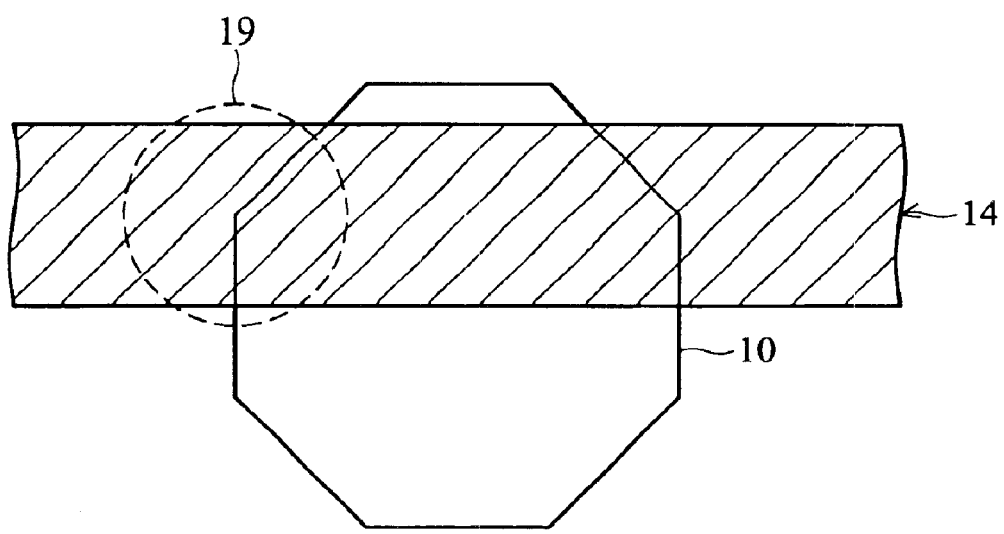
FIG. 2B shows a misalignment between the active area and control gate on a deep trench capacitor.
Figure 7:
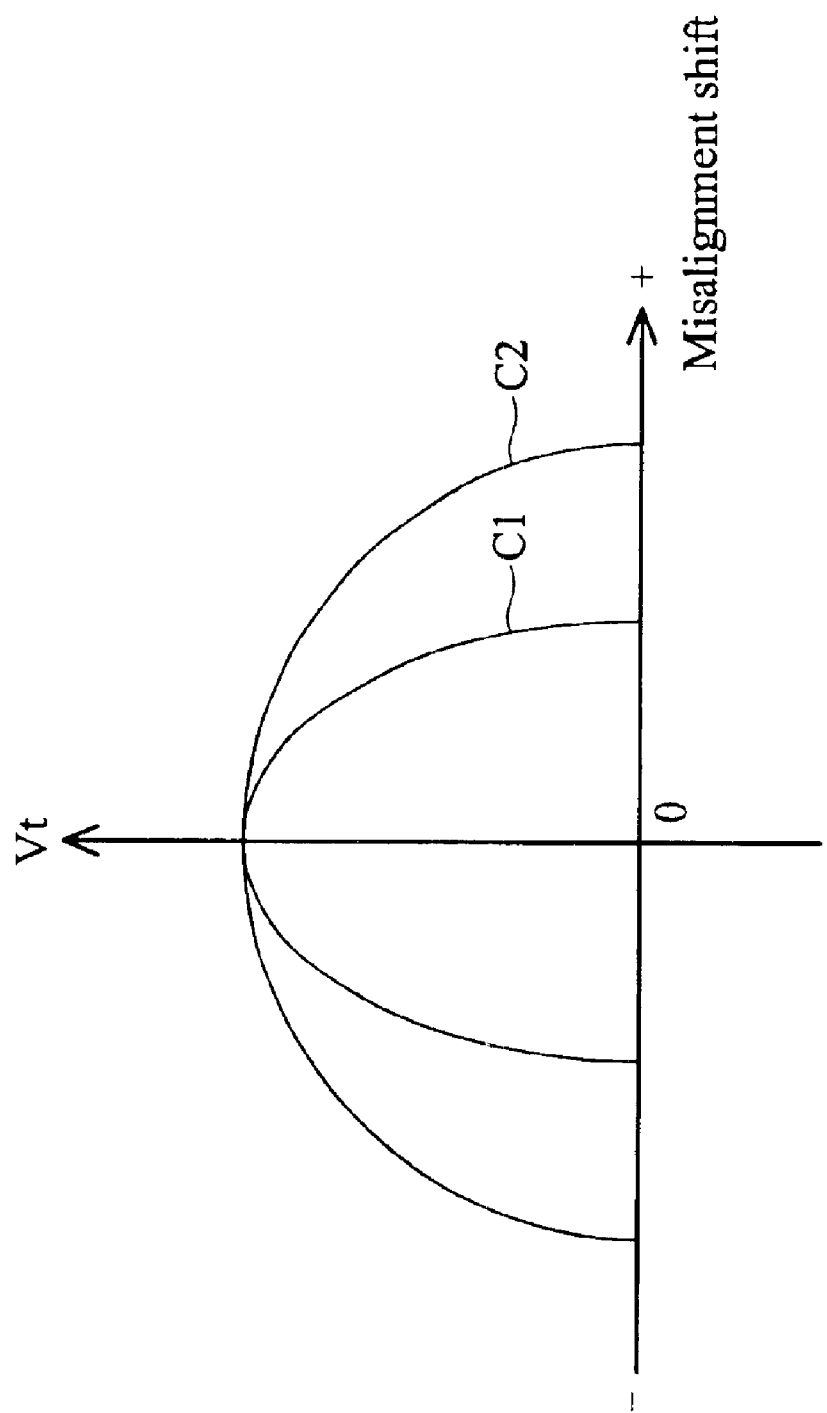
FIG. 7 shows a relationship between the active area shift and threshold voltages of the vertical transistors.

Therefore, the vertical transistors above the deep trench capacitors 10 does not suffer decreased threshold voltage or malfunction easily due to alignment shift between the active areas and the control gates. FIG. 7 shows a relationship between the active area shift and threshold voltages of the vertical transistors. The curve C1 shows the relationship between the active area shift and threshold voltages of the vertical transistors in a conventional memory device as shown in FIG. 1. The curve C2 shows the relationship between the active area shift and threshold voltages of the vertical transistors in the memory device of the present invention as shown in FIG. 5. As shown in FIG. 7, the memory device with vertical transistor of the present invention has better misalignment tolerance for alignment shift between active areas and control gates.

Although the present invention has been described in its preferred embodiments, it is not intended to limit the invention to the precise embodiments disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A method for forming memory device, comprising:
    forming a plurality of deep trenches in a substrate;
    forming a deep trench capacitor in each deep trench;
    forming a diffusion region surrounding each deep trench capacitor in the substrate;
    forming a control gate on each deep trench capacitor;
    forming a word line on each control gate along a first direction;
    forming an active area corresponding to one row of the control gates, wherein the regions overlapping the active area and the control gates have an indentation on both sides; and
    forming two drains on the active area beside the word line using the word line as a mask.

2. The method as claimed in claim 1, wherein each active area have normal portions and recessed portions, each recessed portion is disposed between two normal portions, and each of the recessed portions overlaps one of the control gates thereunder and has an indentation on both sides.

3. The method as claimed in claim 2, wherein each normal portion has a first width, and each recessed portion has a second width smaller than the first width.

4. The method as claimed in claim 3, wherein each normal portion has a lateral surface on both sides, and each recessed portion has two slanted surfaces and a plane surface, and, relative to the lateral surface, each plane surface has a width diminution.

5. The method as claimed in claim 4, wherein the angle of the lateral surface relative to the plane surface is 135°.

6. The method as claimed in claim 1, further comprising a step of forming an isolation layer between each deep trench capacitor and each control gate.

7. The method as claimed in claim 1, further comprising a step of forming a bit line on the active area, wherein the bit line is electrically coupled to the drains in the active areas by bit line contacts.

* * * * *